United States Patent [19]

DeGuise et al.

[11] Patent Number: 4,980,889
[45] Date of Patent: Dec. 25, 1990

[54] MULTI-MODE TESTING SYSTEMS

[76] Inventors: Wayne J. DeGuise, 21 Justin Morgan Dr., Colchester, Vt. 05446; Charles K. Erdelyi, 26 Forest Rd., Essex Junction, Vt. 05452; Steven F. Oakland, 7 Norway Dr., Colchester, Vt. 05446

[21] Appl. No.: 291,727

[22] Filed: Dec. 29, 1988

[51] Int. Cl.⁵ ............................................ G06F 11/00
[52] U.S. Cl. .................................. 371/22.3; 371/22.1
[58] Field of Search ..................... 371/22.3, 22.4, 22.6, 371/22.1, 15.1; 324/73 R, 73 AT, 73.1

[56] References Cited

U.S. PATENT DOCUMENTS

| | | | |
|---|---|---|---|
| 3,771,131 | 11/1973 | Ling | 340/172.5 |
| 4,167,780 | 9/1979 | Hayashi | 364/200 |
| 4,216,539 | 8/1980 | Raymond | 371/22.6 |
| 4,488,259 | 12/1984 | Mercy | 364/900 |
| 4,799,004 | 1/1989 | Mori | 371/22.3 |

OTHER PUBLICATIONS

IEEE Digest of Papers, Proceedings of the International Test Conference, 1982, pp. 414–424, "LSI Self-Test Using Level Sensitive Scan Design and Signature Analysis", by D. Komonytsky.

*Primary Examiner*—Jerry Smith
*Assistant Examiner*—Robert W. Beausoliel

[57] ABSTRACT

A multi-mode testing system is provided which includes first, second and third selector circuits, each of which has a control circuit for selecting one of first and second paths connected to an output, and a single shift register latch having first and second input ports and an output. The first path of the first selector circuit and of the second selector circuit is connected to a data output terminal of a logic circuit under test and the output of the third selector circuit is connected to a data input terminal of the logic circuit under test. A driver circuit has an input connected to the output of the first selector circuit and an output connected to an input/output terminal, with the input/output terminal also being coupled to the first path of the third selector circuit and to the second path of the second selector circuit. The first input port of the latch is connected to the output of the second selector circuit, the second input port is coupled to a scan data input terminal and the output of the latch is connected to the second path of the first selector circuit and of the third selector circuit.

18 Claims, 2 Drawing Sheets

MULTI-MODE TESTING SYSTEMS

TECHNICAL FIELD

This invention relates to semiconductor circuits and, more particularly, to circuits for testing with scanning techniques, such as, with level sensitive scan design (LSSD) using known shift register latches.

BACKGROUND ART

Many circuits are known for employing LSSD testing techniques, which are sensitive to a voltage level rather than to an edge of a pulse, but in general to provide a relatively complete test of a semiconductor circuit, such as a logic circuit of the processor type, very complex circuits must be used which require a large number of test pads or pins installed exclusively for test purposes. With modern technology requiring higher and higher circuit densities on a semiconductor chip, space is not readily available on a chip for large numbers of pads or pins or for complex testing circuitry.

In commonly assigned U.S. Pat. No. 4,488,259, filed by B. R. Mercy on Oct. 29, 1982, there is disclosed an LSSD chip monitor having input and output shift registers which reduce to some extent the number of input-/output pads used for testing and/or controlling certain functions of a chip.

U.S. Pat. No. 3,771,131, filed on Apr. 17, 1972, by A. T. Ling, discloses a computer monitoring and diagnostics system that utilizes a register for latching data on test points located within a computer system.

U.S. Pat. No. 4,167,780, filed on Oct. 21, 1977, by H. Hayashy, discloses scan-in and scan-out registers used for carrying out a diagnostic check.

In an article entitled, "LSI Self-Test Using Level Sensitive Scan Design and Signature Analysis," by D. Komonytsky, Proceedings of the International Test Conference, 1982, pp. 414–424, there is described a method of built-in self-test using internally generated pseudo random patterns applied to chip primary inputs and internal shift register latches in Level Sensitive Scan Design.

DISCLOSURE OF THE INVENTION

It is an object of this invention to provide improved circuits in scan or LSSD testing techniques which are of a simple design yet providing thorough testing of semiconductor chip circuits, which require very few test pads or pin counts, which cause minimal delays in the testing process and which do not require complex and expensive test equipment.

In accordance with the teachings of this invention, a multi-mode testing system is provided, preferably using a standard or conventional LSSD deterministic test, which includes first, second and third selector means, each of which has a control circuit for selecting one of first and second paths coupled to an output, and a single shift register latch having first and second input ports and an output. The first path of the first selector means and of the second selector means is connected to a data output terminal of a logic circuit under test and the output of the third selector means is connected to a data input terminal of the logic circuit under test. A driver circuit has an input connected to the output of the first selector means and an output connected to an input-/output terminal, with the input/output terminal also being coupled to the first path of the third selector means and to the second path of the second selector means. The first input port of the latch is connected to the output of the second selector means, the second input port is coupled to scan data input means and the output of the latch is connected to the second path of the first and of the third selector means.

The foregoing and other objects, features and advantages of the invention will be apparent from the following more particular description of the preferred embodiments of the invention, as illustrated in the accompanying drawing.

BEST MODE FOR CARRYING OUT THE INVENTION

Figure 1:
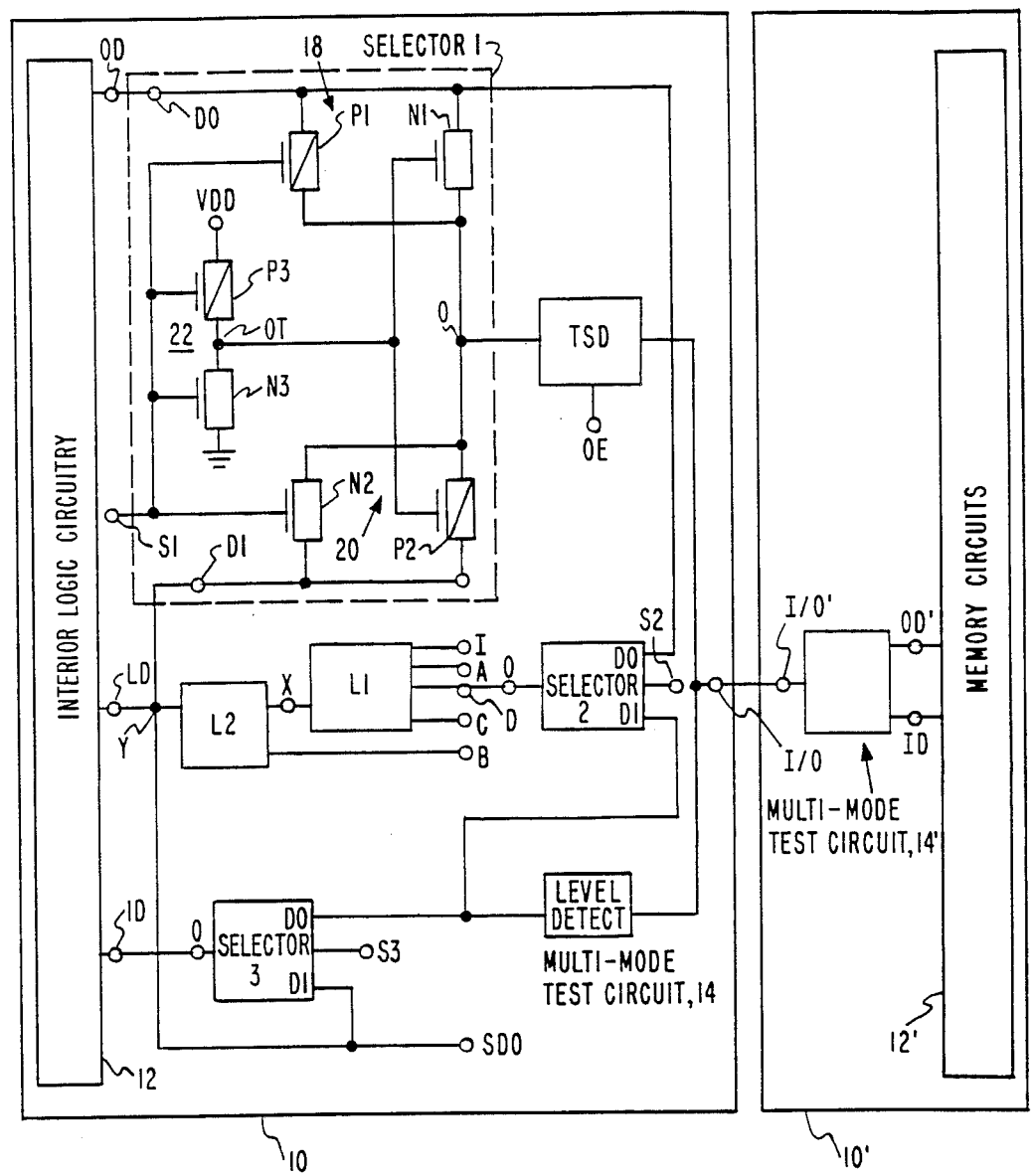
FIG. 1 is a diagram, mostly in block form, of the test system of the present invention.

Referring to FIG. 1 of the drawing in more detail, there is shown a diagram, mostly in block form, of a preferred embodiment of the test system or multi-mode testing system of the present invention. The circuit of the preferred embodiment of the test system of the present invention is made in complementary metal oxide semiconductor (CMOS) technology with P-channel field effect transistors indicated in the drawing by a rectangle with a diagonal line formed therein and a control element or gate electrode arranged adjacent thereto and with N-channel field effect transistors indicated by a rectangle without a diagonal line and a control element or gate electrode arranged adjacent thereto.

The multi-mode testing system of the present invention illustrated in FIG. 1 of the drawing includes a semiconductor chip or substrate 10, which may be made of silicon, on which is formed a circuit 12, e.g., a logic circuit of the processor type, having an input data terminal ID, an output data terminal OD and a latched data terminal LD, a multi-mode test circuit 14 and an input/output pad or terminal I/O. The multi-mode test circuit 14 includes a first selector circuit identified as selector 1 in dash lines having a first input terminal D0 connected to the output data terminal OD of the logic circuit 12, a second input terminal D1 and an output terminal O. A tri-state driver TSD has an input connected to the output O of the selector 1, an output connected to the input/output terminal I/O and an output enable terminal OE which, if desired, may be controlled by pulses oriqinating in the logic circuitry 12. A shift register latch 16 includes a first stage L1 and a second stage L2 having an input connected to an output X of the first stage L1. The first stage L1 includes a first input port I, known as a scan port, for receiving a scan data input pulse under the control of scan A clock pulses applied to terminal A and a second input port D, known as a data port, for receiving data signals from circuits under test under the control of C clock pulses applied to terminal C. The first input port I is used only for test purposes to stimulate logic or other circuits on a semiconductor chip, but the second input port is used during test to observe or test the signals from the logic circuits on the chip and during normal operations. The second stage L2, which has its input connected to the output X of the first stage L1, is under the control scan B clock pulses applied to terminal B. An output Y of the second stage L2 of the latch 16 is connected to the second terminal D1 of the selector 1, latched data terminal LD of the logic circuitry 12 and to a scan data output terminal SDO which may be connected to the first input port I of a following shift register latch in a chain of latches or to any known signal testing system through an input/output pad.

A second selector circuit identified in FIG. 1 of the drawing as selector 2 has a first input terminal D0 connected to the output data terminal OD of the logic circuit 12 and a second input terminal D1. An output O of the selector 2 is connected to the second input port D of the first stage L1 of the shift register latch 16. A third selector circuit identified in FIG. 1 of the drawing as selector 3 has a first input terminal D0, a second terminal D1 connected to the output Y of the second stage L2 of the shift register latch 16 and an output O connected to the input data terminal ID of the logic circuit 12. A level detect circuit identified as level detect in FIG. 1 of the drawing has an input connected to the input/output terminal I/O and an output connected to the first terminal D0 of the selector 3 and to the second terminal D1 of selector 2. The level detect may simply be two conventional CMOS inverters or any known voltage level converter. If desired, a buffer circuit, which simply may be a pair of CMOS inverters, may be interposed between the output terminal O of the selector 3 and the input data terminal ID of the logic circuitry 12.

Each of the three selector or multiplexer circuits or means, selector 1, selector 2 and selector 3, may be made in the CMOS technology as illustrated in FIG. 1 of the drawing. The selector circuit includes a first path or pass gate 18 having a first N-channel field effect transistor N1 connected between the first input terminal D0 and the output terminal O and a first P-channel field effect transistor P1 connected in parallel with the first N-channel transistor N1, and a second path or pass gate 20 having a second N-channel field effect transistor N2 connected between the second input terminal D1 and the output terminal O and a second P-channel field effect transistor P2 connected in parallel with the second N-channel transistor N2. An inverter 22 includes serially arranged third P-channel field effect transistor P3 and third N-channel field effect transistor N3 connected between a voltage supply source VDD having a voltage of, e.g., +5 volts, and a point of reference potential, such as ground. An output terminal OT of the inverter 22 is connected to a control electrode of the first N-channel transistor N1 and of the second P-channel transistor P2. A control pulse is applied to a terminal S1 which is connected to the control electrodes of the first and third P-channel transistors P1 and P3 and of the second and third N-channel transistors N2 and N3 to act as a control circuit. This type of circuit is described in commonly owned U.S. patent application Ser. No. 280071, filed by R. A. Bechade and C. R. Ogilvie on Dec. 5, 1988. It should be noted that selector 2 has a control terminal S2 and that selector 3 has a control terminal S3. These control terminals S1, S2 and S3 may be operated independently or two of them may be connected together, as desired, to operate the multi-mode testing system of the present invention in any one of several different modes. It should be noted that in view of the use of these CMOS pass gates 18 and 20 very little circuit delay, e.g., 0.1 nanoseconds, is encountered when signals travel through the pass gates.

Also illustrated in FIG. 1 of the drawing is a second semiconductor chip or substrate 10', which may be similar to substrate 10, on which is formed a memory circuit 12' having an input data terminal ID' and an output data terminal OD', a multi-mode test circuit 14', which may be similar to the multi-mode test circuit 14, and an input/output terminal I/O' connected to the input/output terminal I/O on the semiconductor chip or substrate 10.

Figure 2:
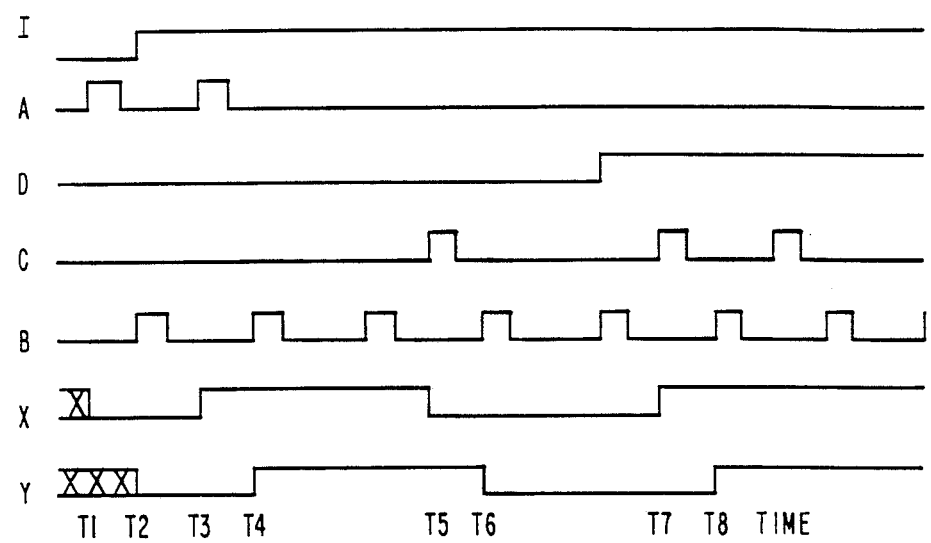
FIG. 2 is a pulse program used in connection with the description of the operation of the shift register latch employed in the test system of the present invention.
Figure 3:
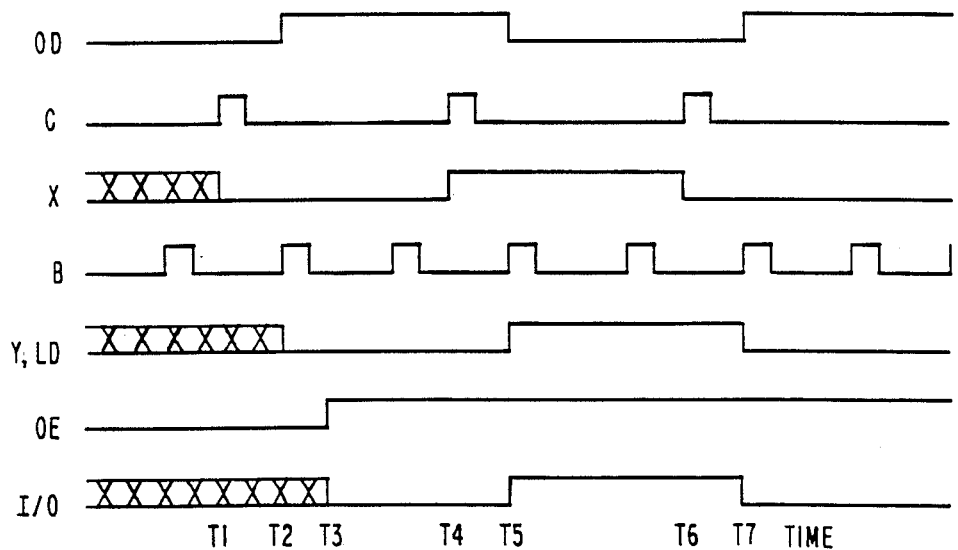
FIG. 3 is a pulse program used in connection with the description of the operation of one of the modes of the test system of the present invention.

The operation of the multi-mode testing system of the present invention may best be understood by referring to the pulse programs shown in FIGS. 2 and 3 of the drawing. Referring first to the pulse program shown in FIG. 2 of the drawing, there is indicated, by way of review, the various voltages found at the seven terminals I, A, D, C, X, B and Y of the first and second stages L1 and L2 of the shift register latch 16 plotted against time. As can be seen from FIG. 2, at time t1 the scan data input signal at terminal I is low and the voltage at terminal X goes low or remains low when clock A goes high, and at time t2 the voltage at terminal Y goes low or remains low when clock B goes high. After clock A is turned off, the scan data input signal at terminal I goes high and clock A again goes high at time t3, the voltage at terminal X also goes high. When clock B goes high again at time t4, the voltage at terminal Y also goes high. With the data input signal at terminal D low and clock C going high at time t5, the voltage at terminal X goes low, and with clock B pulsed high at time t6, the voltage at terminal Y also goes low. When after time t6 the data input signal at terminal D goes high and at time t7 clock C again goes high, the voltage at terminal X also goes high. Then at time t8 when clock B goes high, the voltage at terminal Y likewise goes high. In summary the pulse applied at terminal A captures and holds at terminal X the signal applied to terminal I, and the pulse applied at terminal B captures and holds at terminal Y the signal applied to terminal X, with the pulse applied at terminal C capturing and holding at terminal X the signal applied to terminal D. In this manner data input signals and scan data input signals are passed through the single shift register latch 16 in the multi-mode testing system of the present invention illustrated in FIG. 1 of the drawing. It should be noted that the shift register latches in LSSD are connected into a shift register or scan path by connecting the terminal Y of the stage L2 of one latch to the terminal I, which is the scan data input terminal or pin of the first stage L1 of a following latch. A string of shift register latches connected in this manner forms a single scan path. Data is shifted through the scan path from one latch to the next by pulsing first clock A to each latch and then clock B. A scan path consisting entirely of latches from a multiplicity of multi-mode testing system of the present invention may be called a boundary scan shift register.

In the operation of the multi-mode testing system of the present invention, the single shift register latch may be considered as a portion of a boundary scan shift register capable of (1) controlling chip signal inputs and observing chip signal outputs for testing of on-chip circuits, such as those found in the interior logic circuitry 12, and (2) supplying off-chip driver data and observing off-chip receiver data for testing off-chip circuits, such as the circuits found in the memory circuits on semiconductor chip 10'.

The multi-mode testing system of the present invention as illustrated in FIG. 1 of the drawing can be operated in at least four different operating modes by applying appropriate control voltages to the control terminals S1, S2 and S3 of the selectors 1, 2 and 3, respectively. A high control voltage of, e g., +5 volts, may be considered a logic 1 and a low control voltage, e.g., ground or zero volts, may be considered a logic 0, thus, S1=0 is considered as a low voltage on control terminal S1 and S1=1 is considered as a high voltage on terminal S1.

In a first mode of operation, when S1=0 and S3=0, the system of the present invention operates as a conventional I/O circuit with the following additional features: With S2=0, the output data may be latched for later use by the interior logic circuitry 12 and with S2=1, the data on the input/output pad I/O may be latched for later use by the interior logic circuitry 12. When the output enable voltage at terminal OE of the tri-state driver TSD is low, e,g., at ground or zero volts, the driver TSD is disconnected from the input/output pad I/O, whereby data can be applied to pad I/O from an external source, e.g., a remote chip such as semiconductor chip 10' of the system of FIG. 1 of the drawing. Level detect detects this data and propagates it as input data to the input data terminal ID of the logic circuitry 12. When the output enable voltage at terminal OE of the driver TSD is high, e.g., at +5 volts, the driver TSD drives output data from the logic circuitry 12 to the input/output pad I/O, so that this data can be observed through interconnect wiring at remote circuits such as on the semiconductor chip 10' illustrated in FIG. 1 of the drawing or on a circuit card. Thus, it can be seen that the usage of the input/output pad I/O is time-multiplexed, i.e., it is used part of the time for inputting data to the interior logic circuitry 12 of chip 10 and part of the time for outputting data from the logic circuitry 12 of chip 10 to circuitry located on another chip, such as chip 10'.

In a second mode of operation, when S1=1, S2=0 and S3=0, the testing system of the present invention operates as a latched output circuit in conjunction with a conventional input circuit. Output data is latched in the shift register latch 16 before being propagated to the input/output pad I/O through selector 1 and the driver TSD. In this second mode of operation, as in the first mode of operation, selector 3 passes from its terminal D0 to its output O the signal from the input/output pad I/O, after the signal passes through the level detect.

To more clearly understand the operation of this second mode of operation, reference may be had to the graph shown in FIG. 3 of the drawing. As indicated in FIG. 3 of the drawing, with the output data at terminal OD of the logic circuit 12 low, terminal D0 of the selector 2 selected (because S2=0) and clock C goes high at time t1, the voltage at terminal X of stage L1 goes low, and at time t2 when clock B goes high, terminal Y of stage L2 of the latch 16 also goes low, as does the voltage at the latched data terminal LD of the logic circuit 12. With the voltage at the output enable terminal OE of the driver TSD going high at time t3 and terminal D1 of the selector 1 selected (because S1=1), the voltage at the input/output pad I/O also goes low. When the output data at terminal OD goes high after clock C at time t1 has gone low and clock C goes high at time t4, the voltage at terminal X of the first stage L1 goes high and when clock B goes high at time t5, the voltage at the input/output pad I/O also goes high. With the output data at terminal OD again going low at time t5 and clock C going high at time t6, the voltage at terminal X goes low and the voltage at latched data terminal LD also goes low at time t7 when clock B goes high. Since terminal D1 of selector 1 has been selected and the output enable pulse at terminal OE is still on, the voltage at the input/output pad I/O also goes low. In summary, it can thus be seen that when S1=1, S2=0 and S3=0, the system of the present invention as shown in FIG. 1 of the drawing operates as a latching output circuit. Selector 2 selects terminal D0 to which output data from terminal OD is applied. Clock C captures the output data level at terminal X of the first stage L1 of the latch 16 and clock B provides that data at terminal LD or terminal Y of the latch 16. Selector 1 selects terminal D1 which is connected to the latched data terminal at Y or LD. When output enable is high or at a 1, the driver TSD drives the latched data onto the input/output pad I/O.

In the third mode of operation, when S1=1 and S2=1, the value of S3 being immaterial, the system of the present invention is configured as an interconnect test for testing interconnections at or external wiring connected to the input/output pad I/O. Data presented on the input/output pad from external sources, such as from circuits on the semiconductor chip 10', can be stored in the shift register latch 16 and scanned through the shift register latch 16 scan path for checking. To control the voltage on the input/output pad I/O, a 0 or 1 can be scanned into the latch 16 through terminal I, passed through terminal D1 of the selector 1 and driven by the driver TSD onto the input/output pad I/O. To test the external wiring at the input/output pad I/O, it is necessary both to observe signal levels on the pad I/O and to force signal levels onto the pad I/O. Selector 2 selects the terminal D1 which receives signals from the pad I/O through level detect. Signals applied to the pad I/O after passing through the level detect and selector 2 are stored at terminal Y of the shift register latch with a clock C pulse followed by a clock B pulse. Clock A and clock B pulses then cause the signal at terminal Y to advance to the next position of the scan path.

To force desired signal levels onto the input/output pad I/O, a test value 0 or 1 is shifted into the shift register latch 16 through the scan path at terminal I. The selector 1 selects terminal D1 to pass latched data from the latched data terminal LD or terminal Y of the latch 16 and the driver TSD drives that value onto the input-/output pad I/O when the voltage at terminal OE is high.

In a fourth mode of operation, when S2=0 and S3=1, the value of S1 being immaterial, the system of the present invention is configured for a built-in self test of the logic circuitry 12 or a reduced pin count test. Output data may be stored at terminal Y of the latch 16 and scanned through the shift register latch scan path for observation. Data may also be scanned into the latch 16 to provide stimuli to the logic circuitry 12. With either test, i.e., the built-in self test or the reduced pin count test, it is necessary to be able to observe output data from terminal OD of the logic circuitry 12 and to be able to control input data at terminals LD and ID of logic circuitry 12. Selector 2 selects the terminal D0 to which the output data level from terminal OD is applied. This level is then passed through the latch 16 with the assistance of the clock C pulse followed by the clock B pulse. Clock A and B pulses then propagate the signal through the scan path for observation. In the case of the built-in self test, the scan path feeds into a signature compression register. The results of multiple observations is compressed into a signature. To control input data at terminal ID of the logic circuitry, a test value 0 or 1 is shifted into the latch 16 through the scan path. Selector 3 selects the terminal D1 which is connected to the latched data at terminal Y of the latch 16 propagating the test value into the logic circuitry 12. In the reduced pin count test, the only test pins required are a pin for the scan data input (I) connected to the first latch of the chain and a pin for the scan data output (SDO) connected to the last latch of the chain.

It should be understood that a multiplicity of multi-mode testing circuits, such as at 14, provided on the semiconductor chip 10 can be used to test the entire chip. Also, this single multi-mode testing circuit 14 can be used to assist in the testing of a large number of circuits, logic or memory, disposed on another chip, such as chip 10', which are connected to the input/output pad I/O on chip 10.

It can be seen from the teaching hereinabove and from the figures of the drawing that the multi-mode testing system provides (1) a scannable latch for controlling inputs to the interior logic circuitry and/or observing outputs from the interior logic circuitry, (2) a scannable latch for observing data applied to the input/output pad and/or for providing data to the input/output pad and (3) a low propagation delay bypass around the latch for normal operation. It should also be noted that although the prior art discloses systems which perform one or two tests, the present invention provides a test system which provides many more tests while utilizing a very small amount of space on the semiconductor chip. Furthermore, implementation of boundary scan and/or on-chip self test using this circuit reduces the complexity and cost of the required tester. In-situ burn-in costs are also reduced, allowing improved shipped product quality for integrated semiconductor circuit chips. Testing and characterization of off-chip driver circuits has been simplified. In-place testing of off-chip wiring and circuits is also made possible by the present invention.

While the invention has been particularly shown and described with reference to preferred embodiments thereof, it will be understood by those skilled in the art that various changes in form and detail may be made therein without departing from the spirit and scope of the invention.

What is claimed is:

1. A multi-mode testing system comprising
first, second and third selector means each having an output and a control circuit for selecting one of first and second paths coupled to said output,
an output data terminal connected to the first path of said first selector means and of said second selector means,
an input data terminal connected to the output of said third selector means,
an input/output terminal coupled to the first path of said third selector means and to the second path of said second selector means,
a driver circuit having an input connected to the output of said first selector means and an output connected to said input/output terminal, and
a shift register latch having clocking means, first and second input ports and an output, the first input port being connected to the output of said second selector means, said second input port being coupled to scan data input means and the output of said latch being connected to the second path of said first selector means and of said third selector means.

2. A multi-mode testing system as set forth in claim 1 further including a level detect circuit interposed between said input/output terminal and the first path of said third selector means.

3. A multi-mode testing system as set forth in claim 1 further including a logic circuit having said input data terminal and said output data terminal.

4. A multi-mode testing system as set forth in claim 1 further including a second circuit having an input/output node connected to said input/output terminal.

5. A multi-mode testing system as set forth in claim 1 wherein each of said first, second and third selector means having first and second paths and an output includes
a first N-channel field effect transistor and a first P-channel field effect transistor connected in parallel with said first N-channel transistor in said first path, a second N-channel field effect transistor and a second P-channel field effect transistor connected in parallel with said second N-channel transistor in said second path,
an inverter having an output connected to a gate electrode of said first N-channel transistor and of said second P-channel transistor and
a control pulse terminal connected to an input of said inverter and to a gate electrode of said first P-channel transistor and of said second N-channel transistor.

6. A multi-mode testing system as set forth in claim 5 wherein said inverter includes a third P-channel field effect transistor and a third N-channel field effect transistor.

7. A testing system comprising
a first semiconductor chip,
a multi-mode test circuit,
a logic circuit having an input data terminal and an output data terminal, said terminals being connected to said multi-mode test circuit, and
an input/output pad, said test circuit, said logic circuit and said input/output pad being disposed on said semiconductor chip,
said multi-mode test circuit including
first, second and third selector means each having an output and a control circuit for selecting one of first and second paths coupled to said output, said output data terminal being connected to the first path of said first selector means and of said second selector means, said input data terminal being connected to the output of said third selector means, and said input/output pad being coupled to the first path of said third selector means and to the second path of said second selector means,
a driver circuit having an input connected to the output of said first selector means and an output connected to said input/output pad, and
a shift register latch having clocking means, first and second input ports and an output, the first input port being connected to the output of said second selector means, said second input port being coupled to scan data input means and the output of said latch being connected to the second path of said first selector means and of said third selector means.

8. A testing system as set forth in claim 7 further including a level detect circuit having an input connected to said input/output pad and an output connected to the second path of said second selector means and to the first path of said third selector means.

9. A testing system as set forth in claim 7 wherein said logic circuit further includes a latched data terminal connected to the output of said shift register latch.

10. A testing system as set forth in claim 7 further including a substrate having a circuit including a terminal connected to said input/output pad.

11. A testing system as set forth in claim 10 wherein said substrate is a second semiconductor chip.

12. A testing system as set forth in claim 11 wherein each of said semiconductor chips is made of silicon.

13. A multi-mode testing system comprising
first, second and third selector means, each of said means including an output, first and second circuits and control circuit means for connecting one of said first and second circuits to said output,
a logic circuit having an output data terminal connected to the first circuit of said first selector means and of said second selector means, an input data terminal connected to the output of said third selector means and a latched data terminal,
an input/output terminal coupled to the first circuit of said third selector means and to the second circuit of said second selector means,
a driver having an output enable control terminal, an input connected to the output of said first selector means and an output connected to said input/output terminal, and
a shift register latch having first and second input ports, an output and clocking means, said first input port being connected to the output of said second selector means, said second input port being connected to scan data input means and the output of said latch being connected to the second circuit of said first selector means and of said third selector means and to the latched data terminal of said logic circuit.

14. A multi-mode testing system as set forth in claim 13 wherein the first circuit of each of said selector means includes a first N-channel field effect transistor and a first P-channel field effect transistor connected in parallel with said first N-channel transistor and the second circuit of each of said selector means includes a second N-channel field effect transistor and a second P-channel field effect transistor connected in parallel with said second N-channel transistor.

15. A multi-mode testing system as set forth in claim 13 wherein said control circuit of each of said selector means includes an inverter.

16. A multi-mode testing system as set forth in claim 15 wherein said inverter includes an N-channel field effect transistor and a P-channel field effect transistor.

17. A multi-mode testing system as set forth in claim 13 wherein said shift register latch includes a first stage and a second stage and said clocking means includes clock A means for controlling said first input port, clock C means for controlling said second input port and clock B means for controlling said second stage.

18. A testing system comprising
a first semiconductor chip,
a first multi-mode test circuit,
a first data circuit having input data and output data terminals connected to said first multi-mode test circuit,
a first input/output terminal connected to said first multi-mode test circuit, said first multi-mode test circuit, said first data circuit and said first input/output terminal being disposed on said first semiconductor chip,
a second semiconductor chip,
a second multi-mode test circuit,
a second data circuit having input data and output data terminals connected to said second multi-mode test circuit,
a second input/output terminal connected to said second multi-mode test circuit, said second multi-mode test circuit, said second data circuit and said second input/output terminal being disposed on said second semiconductor chip,
at least one of said first and second multi-mode test circuits including
first, second and third selector means each having an output and control circuit means for selecting one of first and second paths connected to said output,
a driver circuit having an input connected to the output of said first selector means and an output connected to one of said input/output terminals, and
a shift register latch having first and second input ports and an output, said first input port being connected to the output of said second selector means, said second input port being coupled to scan path input means and the output of said latch being connected to the second paths of said first and third selector means.

* * * * *